United States Patent [19]

Roohparvar

[11] Patent Number: 5,617,350
[45] Date of Patent: Apr. 1, 1997

[54] FLASH MEMORY SYSTEM HAVING REDUCED DISTURB AND METHOD

[76] Inventor: Frankie F. Roohparvar, 5855 Bollinger Rd., Cupertino, Calif. 95014

[21] Appl. No.: 509,876

[22] Filed: Aug. 1, 1995

[51] Int. Cl.$^6$ .................................................. G11C 11/34
[52] U.S. Cl. ........................... 365/185.02; 365/185.33; 365/233.5
[58] Field of Search ..................... 365/185.02, 185.33, 365/185.18, 233.5

[56] References Cited

U.S. PATENT DOCUMENTS 5,317,535  5/1994  Talreja et al. ....................... 365/185.02
5,434,815  7/1995  Smarandoiu et al. .............. 365/189.01

Primary Examiner—David C. Nelms
Assistant Examiner—Huan Hoang
Attorney, Agent, or Firm—Limbach & Limbach L.L.P.

[57] ABSTRACT

A flash memory system having a reduced tendency to have its erased cells disturbed during read operations. An array of flash memory cells are arranged into a multiplicity of rows and columns, with all of the cells located in one of array rows has a control gate connected to a common word line and with all of the cells in a column has a drain connected to a common bit line. Control circuitry is used for carrying out memory operations, including program circuitry for programming cells of the array based upon a program input address and read circuitry for reading cells of the array based upon a read input address. The read means functions to apply a read voltage to a selected one of the word lines of the array as determined by the read input address. Disturb limit circuitry is used for limiting the time period that the read circuitry applies the read voltage to the selected one of the word lines.

16 Claims, 6 Drawing Sheets

FLASH MEMORY SYSTEM HAVING REDUCED DISTURB AND METHOD

FIELD OF THE INVENTION

The present invention relates to flash memory systems and, in particular, to memory systems having improved data retention due to a reduced tendency to disturb erased flash cells.

BACKGROUND ART

Flash memory systems have been developed which provide non-volatile data storage capability and a relatively large capacity. In attempting to increase the storage capacity of these memory systems further, the size of the individual memory cells has been significantly reduced. As will be explained, this reduction in cell size has been accompanied by a decrease in the data retention of the cell because of an increased tendency to disturb the programmed state of the cell during various memory operations, including read operations.

Referring to the drawings, FIG. 1A shows an exemplary conventional flash memory cell 10 with voltages applied for carrying out a program operation. The exemplary cell 10 is formed in a P type substrate 12. An N+ source region 14 and an N+ drain region 16 are also formed in the substrate. The source and drain regions 12 and 14 are spaced apart so as to define an intermediate channel region 12a.

A floating gate 18 is disposed above the channel region 12a and spaced apart from the channel region by a thin (100 Å) gate oxide. The floating gate 18 is formed from doped polysilicon and is electrically isolated from the other cell elements except for capacitive coupling. A polysilicon control gate 22 is disposed above the floating gate 18 and is separated from the floating gate 18 by an interpoly dielectric 24.

The state of cell 10 is altered by adding charge to the floating gate 18 and removing charge from the floating gate. This difference in charge causes the threshold voltage of the cell 10 to be altered so that the state of the cell 10 can be ascertained in a read operation to be described. When the cell 10 is in an erased state, there is typically a relatively small negative charge on the floating gate. When the cell 10 is in a programmed state, there is typically a relatively large negative charge on the floating gate.

Cell 10 is shown in FIG. 1A configured for a programming operation. A positive voltage (typically +6 volts) is applied to drain 16 and the source is grounded. A large positive voltage (typically +12 volts) is applied to the control gate 22. These conditions will create an electric field which will cause electrons to be accelerated from the source region 14 to the drain region 16. In addition, an electric field will be created by the large positive voltage on the control gate 22. Some of the electrons moving from the source to the drain will have sufficient energy to pass through the gate oxide 20 and collect on the floating gate. The mechanism is sometimes referred to as hot electron injection. The amount of charge transferred to the floating gate 18 is very time dependent. A typical programming operation will require that the FIG. 1A conditions be present for a relatively long duration which may be on the order of 10 microseconds. As a comparison, a typical read operation will typically take less than a hundred nanoseconds.

FIG. 1C shows exemplary conditions for reading a flash cell. The source region 14 is grounded and the drain region is connected to a small positive voltage (typically +1 to +2 volts). A positive voltage (typically +5.5 volts) is applied to the control gate 22. The electrons present on the floating gate 18 will alter the threshold voltage of the cell, that is, the control gate to source voltage which must be applied to cause the cell to conduct one microampere of current. A cell which has not been programmed will have a relatively low threshold voltage of typically +3 volts and a programmed cell will typically have a programmed threshold voltage of +5 to +6 volts.

Assuming that cell 10 has been programmed, the gate-source voltage of +5.5 volts will be near the programmed threshold voltage so that very little current may flow. The absence of cell current will indicate that the cell has been programmed thereby indicating the state of the cell. A programmed cell indicates, by common convention, a logic "0". If the cell were in an erased state, the gate-source voltage of +5.5 volts would exceed the erased threshold voltage of +3 volts. Thus, the cell will conduct a current thereby indicating that the cell is an erased cell. By common convention, an erased cell represents a logic "1".

Although not depicted in FIG. 1C, during a read operation, the cell current is converted to a voltage which is compared with a reference voltage by a sense amplifier. The output of the sense amplifier thus will be at one state indicating that the cell was erased (a logic "1") and another state indicating that the cell was programmed (a logic "0").

FIG. 1B shows the conditions for erasing a flash cell 10. A large positive voltage, typically +10 volts is applied to the source region 14 and the drain region 16 is left floating. In addition, the control gate 22 is grounded. In most flash memories, all or a large block of cells are erased at the same time. Thus, these cells all have their source regions 14 connected in common to +10 volts, their control gates 22 connected to ground and their drain regions all floating. These conditions will result in a strong electric field being produced between the source region 14 and the floating gate 18. This field will cause electrons present on the floating gate 18 to pass through the thin gate oxide 20 and to the source region. The mechanism for transferring electrons is referred to as Fowler-Nordheim tunneling. The removal of electrons will cause the cells to change from a programmed cell to an erased cell.

In erase operations, it is possible to remove too many electrons from the floating gate 18 so that a net positive charge will remain. This will tend to reduce the threshold voltage to the point that cell current will flow even when the gate-source voltage is zero. This "overerase" condition is undesirable since a cell will conduct current even when it is not being read. This current will tend to mask the current flow of the cell actually being read thereby preventing proper memory operation.

Many erase operations include sub-operations for correcting possible overerase conditions. One such sub-operation, is sometimes called a "heal" cycle. As will be explained, the heal cycle functions to both correct for overerase, and function to reduce the distribution of the erases threshold voltage of the cells so that they are more uniform after an erase operation.

In a heal cycle, the source regions 14 of all of the cells are grounded and the drain regions 16 are all left floating. In addition, the control gates are all connected to a large positive voltage, such as +12 volts. These conditions will cause an electric field to be formed between the source region 14 and the floating gate 18. The strength of the electric field will be a function of the floating gate 18 voltage, with that voltage being greater for cells that have a low threshold voltage, including those cells that have been overerased. The electric field will cause electrons to be transferred from the source region 14 to the floating gate 18, thereby increasing the erased threshold voltage of the cells. Those cells having the lowest threshold voltage will be increased the greatest amount and those having a higher threshold voltage will be affected to a much lesser extent. The heal cycle is controlled so that the erased threshold voltage of all the cells will approach some nominal value such as +3 volts.

A typical flash memory system ideally maintains a programmed state indefinitely. In practice, many memory systems are specified to retain data for periods ranging from ten years to a hundred years. A principal cause of data loss is the result of electrons being slowly removed from the floating gate 18 over time. With smaller and smaller cell geometries, the capacitances associated with the floating gates have become very small, typically on the order of a Femto Farad ($10^{-15}$ Farads). Thus, removal of only a small number of electrons will result in a large change in threshold voltage.

It should also be noted that even if the state of a cell has not changed because of a change in the charge present on the floating gate, the performance of the memory may be degraded to the extent that it is no longer usable, By way of example, as the erased and programmed threshold voltages approach one another, the read error margin is reduced. In addition, the time required to perform memory operations, particularly read operations, is dependent upon the magnitude of the cell current. If, for example, the cell's erased threshold voltage is increased due to a gain of electrons on the floating gate 18, the cell may conduct sufficient current in a read operation such that the state of the cell will be correctly read. However, the increased threshold voltage will reduce the magnitude of the cell current to the point that the current will not be capable of shifting the voltage state of the array bit line sufficiently fast to carry out a read operation within memory specifications (typically on the order of a hundred nanoseconds).

There are two principal mechanisms that affect the ability of a flash memory to retain data over a long time period. One mechanism is sometimes referred to as "read disturb" and the other is sometimes referred to as "word line disturb". Read disturb occurs when a cell 10 is being read. As can be seen in FIG. 1C, a read operation creates an electric field between the source region 14 and drain region 16 due to the positive voltage (+1 to +2 volts) applied to the drain region. A very small number of electrons traveling between the drain and source regions will have sufficient energy to be drawn up to the floating gate 18 due to the positive control gate 22 voltage. Thus, the cell is very slightly programmed by way of hot electron injection in the region adjacent the drain 16 in a read operation. This is true even though the time required to perform a read operations is much less than that required to perform a conventional programming operation. The strength of the electric field between the drain and source is inversely proportional to the length of the channel 12a, with such channel length becoming smaller as cell geometries become smaller. Accordingly, this read disturb phenomena becomes more pronounced as cell sizes are reduced.

Word line disturb occurs under various conditions where a large positive voltage is applied to the control gate 22 of the cell 10, with the control gate of a cell being connected to the array word line. By way of example, in the above-described heal cycle, the source region 14 is grounded and the control gate is connected to +12 volts. These conditions result in a small number of electrons being transferred from the source region 14 to the floating gate 18 by way of Fowler-Nordheim tunneling.

Although the read and word line disturb phenomena result in only a very small transfer of electrons, it should be remembered that there may be several hundred thousand read operations for a single programming operation. Further, the capacitances associated with the floating gates of small geometry cells are so small that a change in charge due to a transfer of only a few thousand electrons will result in a floating gate potential change of one volt.

The present invention is directed to a flash memory system having improved immunity to the above-noted affects of read and word line disturb. This is accomplished without the necessity of modifying the cell geometry and without altering the basic mechanisms for performing programming, reading and erasing operations. These and other advantages of the present invention will become apparent to those skilled in the art upon a reading of the following Detailed Description of the Invention together with the drawings.

SUMMARY OF THE INVENTION

A flash memory system having a reduced tendency to have its erased cells disturbed during read operations is disclosed. The system includes an array of flash memory cells arranged into a multiplicity of rows and columns. All of the cells located in one of array rows have a control gate connected to a common word line and all of the cells in a column have a drain connected to a common bit line.

The memory system further includes control means for carrying out memory operations, with the control means including program means for programming cells of the array based upon a program input address and read means for reading cells of the array based upon a read input address. The read means functions to apply a read voltage to a selected one of the word lines of the array as determined by the read input address.

The memory system still further includes disturb limit means for limiting a time period that the read means applies the read voltage to the selected one of the word lines. In one embodiment, the disturb means utilizes the memory system address transition detection circuitry to limit the time period over which the read voltage is applied to the selected word line.

DETAILED DESCRIPTION OF THE INVENTION

Figure 2:
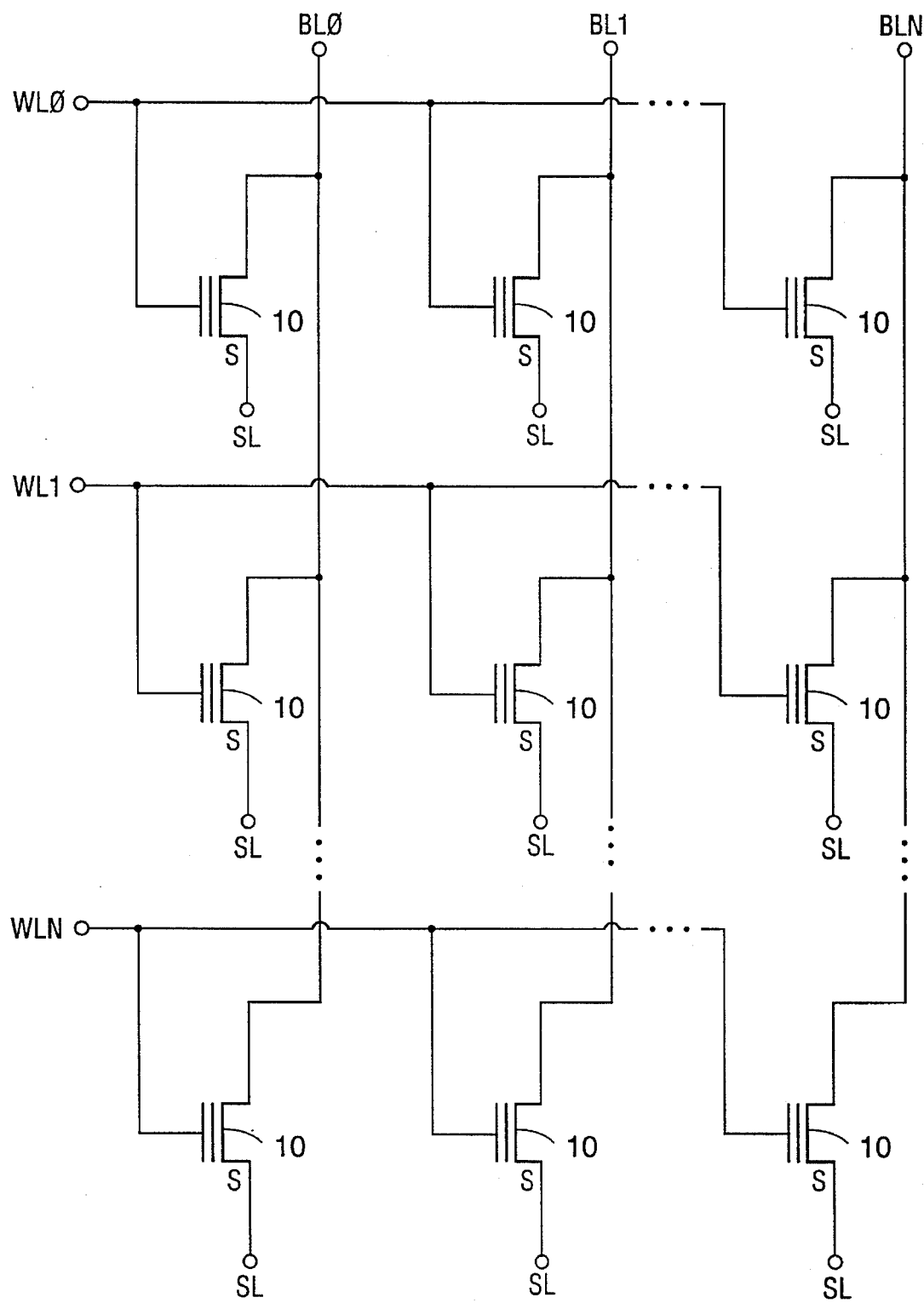
FIG. 2 is a flash cell array comprised of individual cells as depicted in FIGS. 1A–1C.
Figure 3:
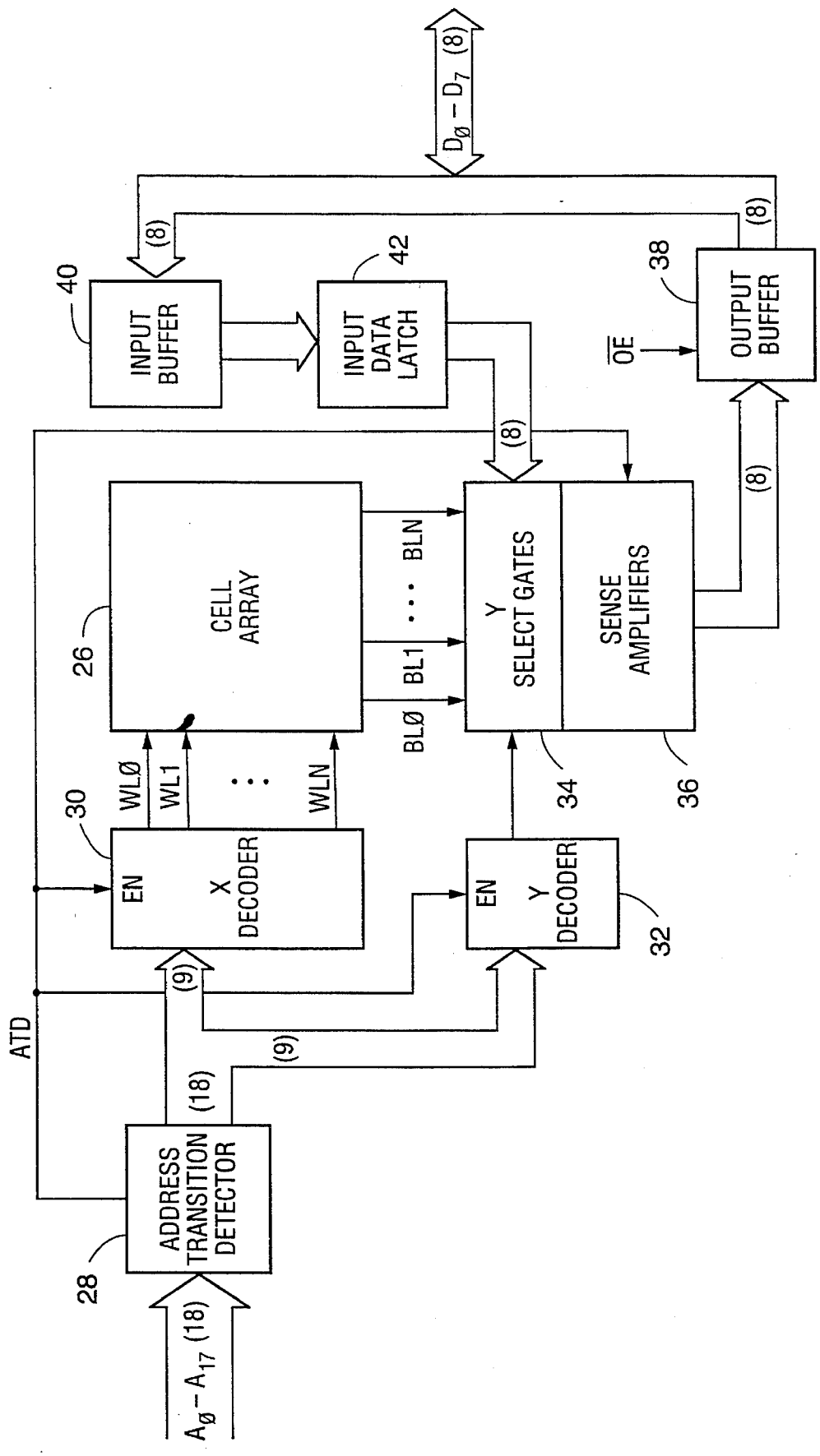
FIG. 3 is a block diagram of a memory system in accordance with the present invention.

Referring again to the drawings, FIG. 3 is block diagram of an exemplary embodiment of the subject memory system. The system includes an array 26 of flash memory cells. Details of the array may be seen in FIG. 2. The array is comprising of cells 10, such as disclosed in FIGS. 1A–1C, arranged in rows and columns. In the present embodiment, there are a total of 512 rows and 512×8 columns of cells 10. All of the cells in a column have their drain regions 16 connected to a common bit line BLN and all of the cells in a row having their control gates 22 connected to a common word line WLN. All of the source regions 14 of the cells are connected together, or, alternatively, large blocks of the cells have their source regions connected together by a common source line SL(not depicted). The source line SL can be connected to a circuit common or connected to other potentials for carrying out erase operations and the like.

The memory system receives a total of eighteen addresses (A0–A17) for selecting one eight bit word from the cell array. The addresses are coupled to an address transition detector 28. As is well known, the primary function of an address transition detector circuit is to sense address transitions and to determine when all of the inputted addresses have stabilized so that memory read operations can be carried out. In addition, the detector may function to precondition various memory elements for an anticipated memory read operation when an address transition is first detected. A suitable address transition detector circuit is disclosed in Application Ser. No. 08/506,168 filed on Jul. 25, 1995 and entitled ADDRESS TRANSITION DETECTION (ATD) CIRCUIT. The contents of this application are hereby fully incorporated into the present application by reference.

As will be explained in greater detail, detector circuit 28 generates an output signal ATD which goes high when a transition is first detected on any of the eighteen address inputs. Signal ATD remains high until the final address transition is detected thereby indicating that all of the inputted addresses are at their final state so that the appropriate word of cell array 26 may be addressed. Once the word is addressed, a memory read operation can be completed. Signal ATD will remain high an additional period of time after the last address transition so that the indicted memory operation can take place. In a read operation, signal ATD will remain high an additional 150 nanoseconds so the selected word may be read.

Figure 1A:
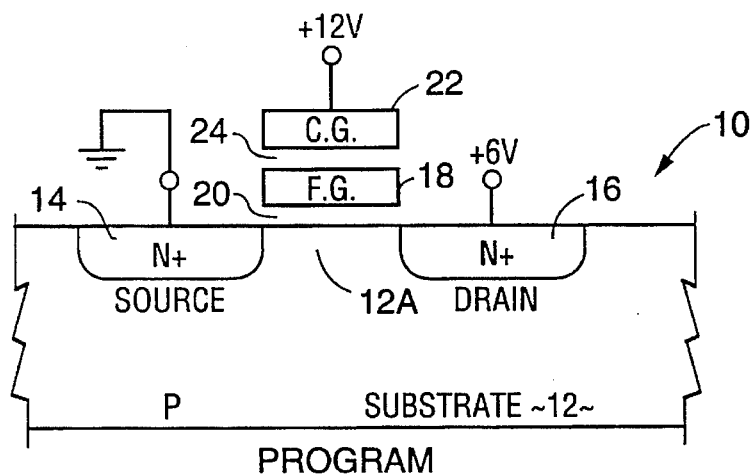
FIGS. 1A–1C depict a conventional flash memory cell configured for carrying out program, erase and read operations, respectively.
Figure 1B:
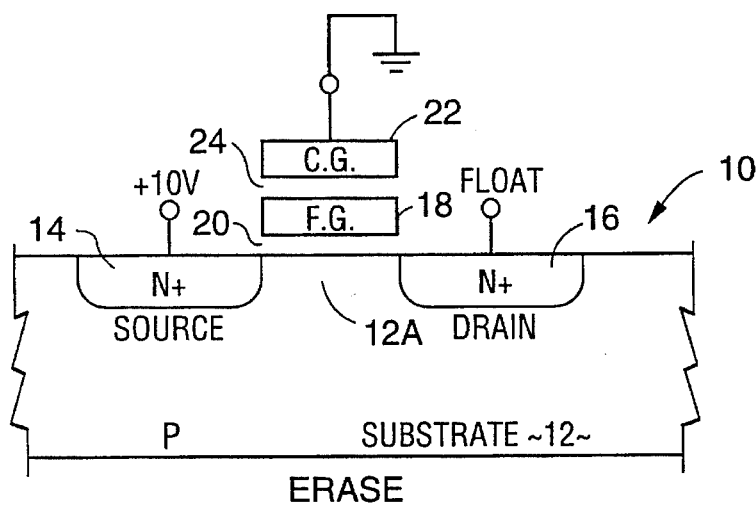
Figure 1C:
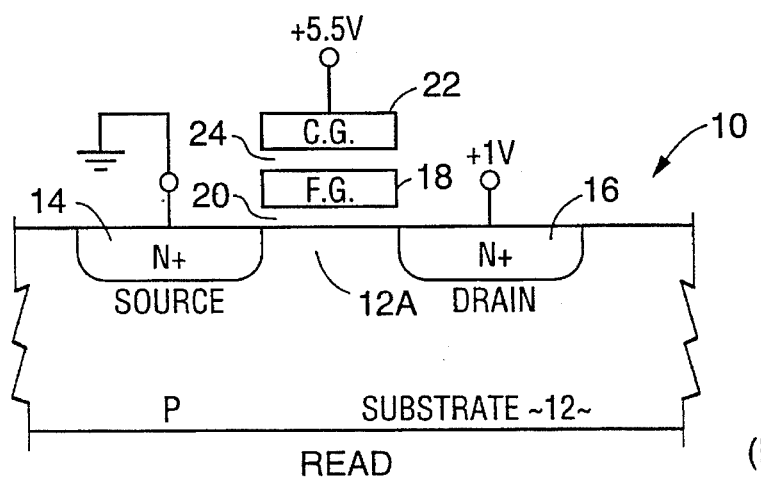

Nine of the eighteen addresses, addresses A0–A7, are forwarded to an X Decoder circuit 30 and the remaining nine (A8–A17) are forwarded to a Y Decoder circuit 32. The X Decoder circuit 30 functions to decode the nine inputted addresses and select one of the 512 word lines WL0–WLN of the cell array 26. The selected word line contains the eight bit word which is to be read or programmed. In a memory read operation, X Decoder circuit 30 functions to apply +5.5 volts to the selected word line WLN, as indicated by FIG. 1C. In program operations, circuit 30 functions to apply +12 volts to the selected word line WLN, as indicated by FIG. 1A.

The Y Decoder 32 uses the received nine bits of address and selects one of the eight bit words indicated by the address bits using a Select Gates circuit 34. Eight sense amplifiers, represented by block 36, are used for carrying out read operations and other memory verification operations. If a read operation is to take place, the Select Gates circuit 34 connects eight bit lines BLN to the respective inputs of eight sense amplifiers 36. In addition, the circuit for generating the voltage applied to the bit line BLN and having a magnitude ranging from +1 to +2 volts (FIG. 1C) is connected to the selected bit lines BLN.

The outputs of the eight sense amplifiers indicate the state of the eight cells being read. These output are provided to a data output buffer 38 and then forwarded to the Data I/0 terminals DO–D7 of the memory system. The output buffer 38 is made active by a low (active) signal $\overline{OE}$, with signal $\overline{OE}$ going high during programming operations, thereby forcing the output of the buffer to a high impedance state so that it does not interfere with the inputting of data during program operations.

In a memory program operation, the eight bits of data to be programmed are provided on the Data I/O terminals and forwarded to input buffer 40. At this time, the output of the Data Output buffer 38 is switched to a high impedance state. The data to be programmed is then fed to an Input Data latch 42 and held there during the programming operation. The X Decoder circuit 30 functions to apply the large programming voltage of +12 volts to the selected word line WLN as previously noted in connection with FIG. 1A. In addition, the Y Decoder 32 will function to couple a medium level voltage, typically +6 volts, to those ones of the selected eight bit lines BLN which are to be programmed based upon the input data.

In a conventional memory system, the memory circuit must be enabled by an external source, such as an associated processor, in order to carry out any memory operation. This signal, typically called the chip enable signal ($\overline{CE}$), is made active (low) at the beginning of a memory operation and remains active until the memory operation is completed. Conceivably, a user may program an associated processor to force signal $\overline{CE}$ to be active (low) all the time or the user may program the processor to make the signal active only when the memory is being used.

A conventional X Decoder circuit will typically function to apply a positive voltage to one of the word lines WLN whenever the chip enable signal $\overline{CE}$ is made active. Thus, during the time period when the signal $\overline{CE}$ is active, one of the word lines WLN will have +5.5 volts applied to it by an X Decoder circuit. Thus, all of the cells in the selected row will have their control gates 22 connected to +5.5 volts when $\overline{CE}$ is active. Further, the source line connected to at least the cells in the selected row will all be connected to the circuit common. In addition, the Select Gate circuit will connect a small positive voltage (+1 to +2 volts) to the eight bit lines BLN of the selected word. The remaining or deselected bit lines BLN are left floating.

With respect to the eight cells 10 of a conventional memory system that have been selected by X Decoder and Y Decoder circuits, such cells will be subjected by the previously described read disturb phenomena. The electric field between the source and drain regions will create a small number of hot electrons which will be transferred to the positive floating gate by injection. The longer these conditions exist, the greater the magnitude of the disturb. This will tend to soft program the cells that are erased. These soft programming conditions (read conditions) produce orders of magnitude smaller programming currents as opposed to regular programming conditions due to the smaller electric fields. However, the read conditions could conceivably be present for a much longer period of time than the program conditions (years versus microseconds) so that a disturb may occur.

With respect to remaining cells 10 of the selected word line of the conventional memory system, those cell will also have +5.5 volts connected to their control gates. The bit lines BLN connected to these deselected cells will be floating and the source lines will be connected to circuit common. Thus, these deselected cells of the selected row will be subjected to what was previously referred to as word line disturb. This will cause electrons to be transferred to the floating gate of these cells by way of Fowler-Nordheim tunneling from the source side of the cell. Although the voltages applied to these deselected cells will be less than that used in the previously described heal cycle, some word line disturb will occur. Again, the effects of this disturb are cumulative so that the longer these conditions exist, the greater the magnitude of the disturb.

Figure 4:
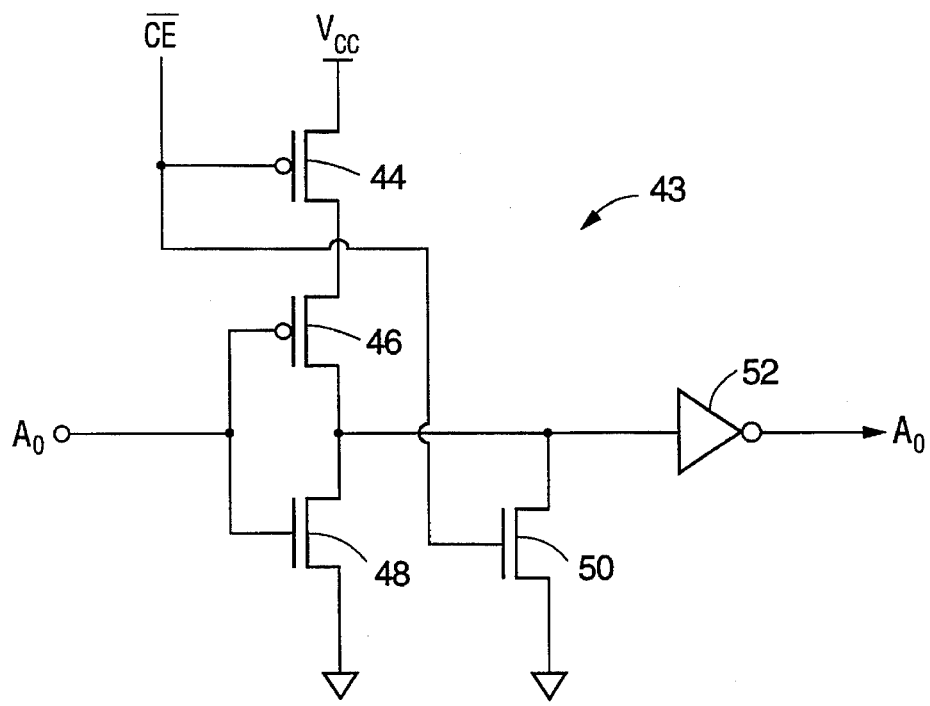
FIG. 4 is a schematic diagram of an address buffer circuit of the FIG. 3 memory system.

Even when the chip enable signal $\overline{CE}$ is inactive, there will be some form of disturb. FIG. 4 shows a conventional address buffer circuit 43 which is typically part of the address transition detection circuit. Each memory system address has an associated buffer circuit 43. The buffer circuit includes a pair of P channel transistors 44 and 46 connected in series with an N channel transistor 48 to form an inverting input stage. Transistors 46 and 48 have their gates connected in common to form the circuit 43 input and their drains connected together to form the output of the input stage.

The output of the input stage of circuit 43 is coupled to an inverter stage 52 so that the buffered address is provided at the output of stage 52. The address buffer circuit is usually designed to be disabled by the chip enable signal $\overline{CE}$ to reduce the current consumption of the buffer during inactive periods. Transistor 44 is connected between the power supply voltage VCC and input stage transistor 46. The gate of transistor 44 is connected to receive the chip enable signal $\overline{CE}$ so that the input stage is enabled when signal $\overline{CE}$ is active (low).

When signal $\overline{CE}$ is inactive, transistor 44 is off so that both transistors 46 and 48 of the input stage are off. The input of the inverter stage 52 would be effectively an open circuit, an undesirable condition, but for the presence of an N channel transistor 50 connected between inverter stage input and the circuit common. The gate of the transistor 50 receives the chip enable signal $\overline{CE}$ so that transistor 50 will be conductive when signal $\overline{CE}$ is inactive (high). Thus, the input of inverter stage 52 will be forced to a low state so that the output of the address buffer circuit 43 will be high. This "address" corresponds to either the first or the last row of the cell array depending upon the manner in which the memory system is implemented. Accordingly, when the chip enable signal $\overline{CE}$ is inactive in a conventional memory system, a conventional x Decoder will apply a positive read voltage to the word line of the last or first array row. The cells in these rows will suffer from the above-described disturb conditions since the memory system could be in the inactive mode for years.

Figure 6:
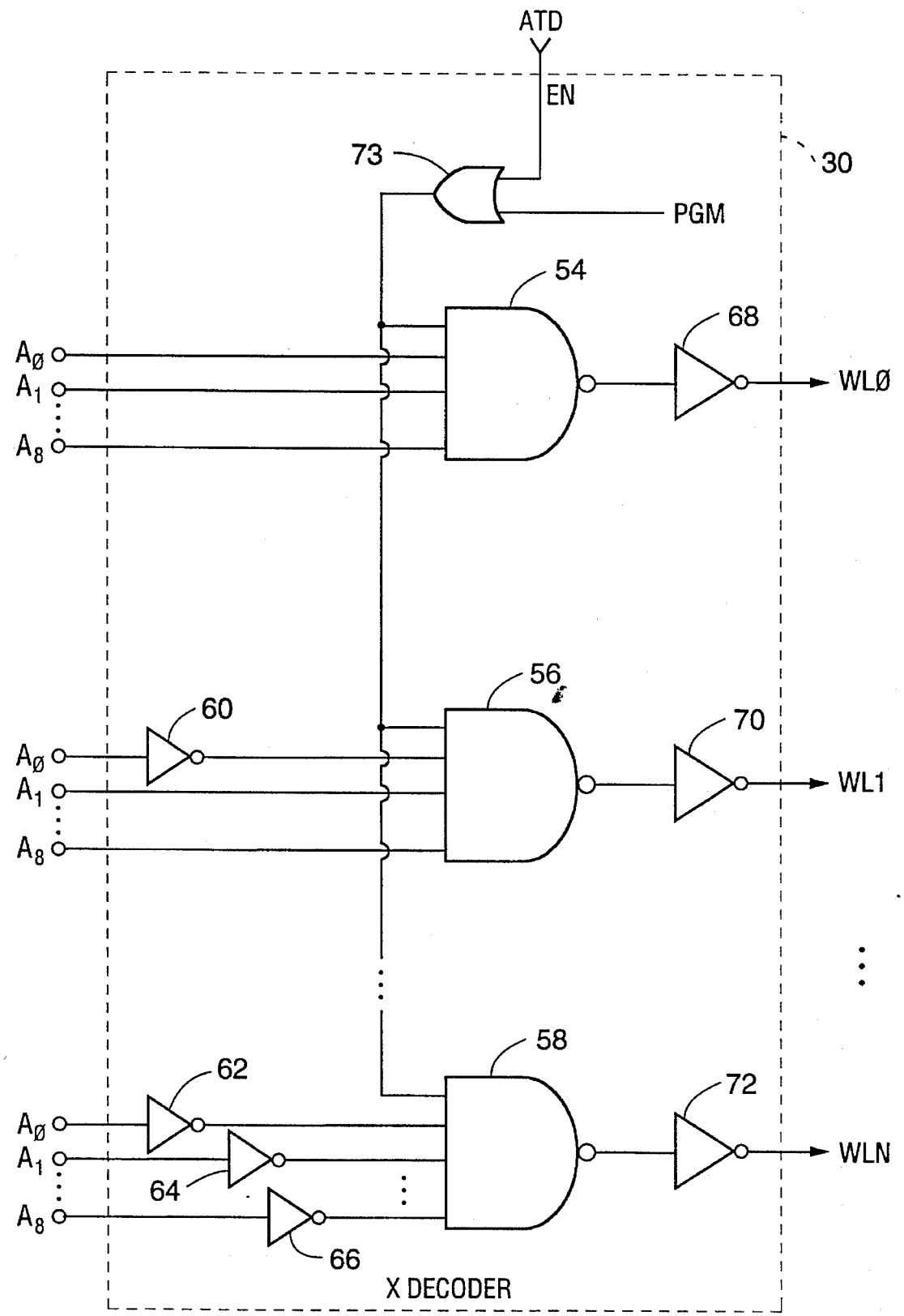
FIG. 6 is a schematic diagram of the X decoder of FIG. 3 memory system.

FIG. 6 shows many of the details of the X Decoder circuit 30 of the present invention. The primary function of the X Decoder circuit 30 is to decode the nine input addresses A0–A8 during program and read operations and to select one of the 512 word lines WLN based upon the decode by applying the appropriate voltage for carrying out the program or read operations. The FIG. 6 diagram shows exemplary decode circuitry, including a NAND gate 54 for detecting when the nine addresses inputs are all logic "1"s, a NAND gate for detecting when all nine bits of address, except for address bit A0 which is inverted by inverter 60, are a logic "1" and a NAND gate 58 for detecting when all nine address bits are a logic "0". The latter decode is accomplished by inverting all nine addresses A0–A8 using nine inverters 62, 64, 66, etc.

The outputs of the exemplary NAND gates 54, 56 and 58 are inverted by inverter circuits 68, 70 and 72, respectively.

When a read operation is to be performed, a positive voltage equal to +5.5 volts is applied to the selected word line WLN, with the deselected word lines being grounded. In a programming operation, X Decoder circuit 30 will apply a large positive of +12 volts to the selected word line. This can be accomplished by taking the supply voltage for the X Decoder 30 to those voltages (+5.5 volts and +12 volts). Alternatively, inverters 68, 70 and 72 could be implemented as level shifters to achieve the same results.

Each of the nine decode NAND gates of the X Decoder circuit 30, including exemplary gates 54, 56 and 58, also receives the address transition detector 28 output signal ATD by way of an OR gate 73. A second input to OR gate 73 receives a signal PGM which is active (high) when the memory system is performing a program operation and inactive during the other operations such as read operations. When signal ATD is inactive (low), none of the word lines WLN are selected, i.e., word lines WL0–WLN all have zero volts applied to them by the X Decoder 30. When signal ATD is actives the read voltage (+5.5 volts) is connected to selected word line WLN based upon the nine bits of address. When signal PGM is active, a program voltage is applied to the selected word line, independent of signal ATD.

As previously explained, signal ATD goes active when a transition is detected on any address terminal and remains active for 150 nanoseconds after the last address transition. The 150 nanosecond time period is selected to provide the memory system with more than sufficient time to carry out a memory read operation. At the end of the 150 nanosecond time period, all word lines will go inactive thereby greatly minimizing the amount of time the cells will be subjected to either a read or a word line disturb. In addition, circuit 28 is implemented so that signal ATD is produced when the chip enable signal $\overline{CE}$ goes active. Thus, even if there is no transition on the address terminals, signal ATD will be produced when signal $\overline{CE}$ goes active.

Signal ATD is also connected to the Y Decoder circuit so that when signal ATD is inactive, none of the bit lines BLN are connected to the +1 to +2 volts during read operations. This will further reduce the tendency to disturb the erase state of the cells, as will be explained.

Figure 5:
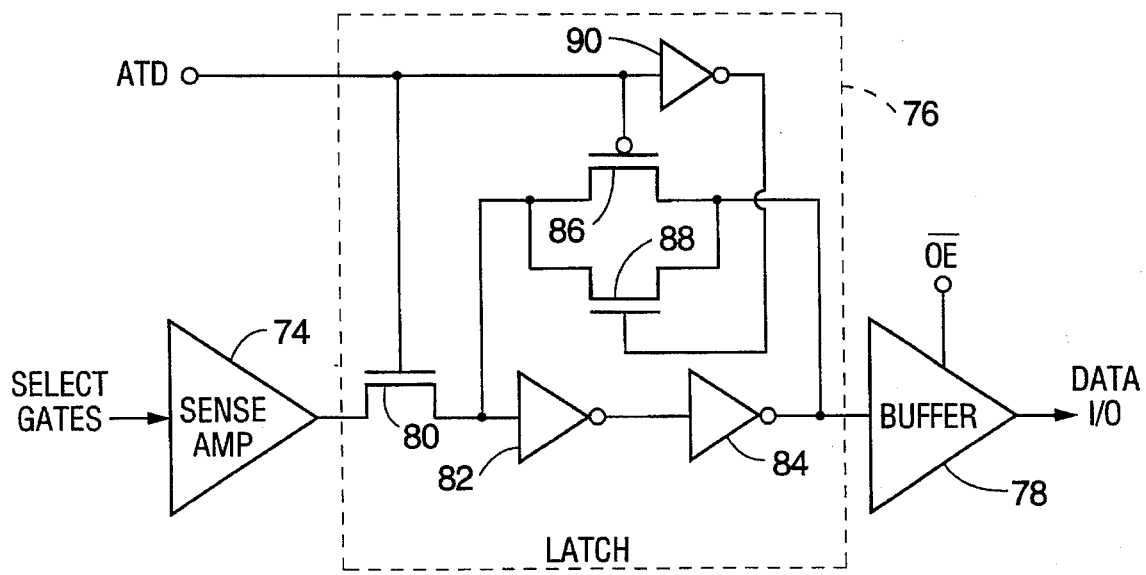
FIG. 5 is a schematic diagram of an data output path, which includes a data latch circuit, of the FIG. 3 memory system.

In a read operation, a conventional memory system typically couples the output of the sense amplifiers used in the read operation to the memory data output buffers. An associated processor expects the read data to be valid as long as the output enable signal $\overline{OE}$ and the chip enable signal $\overline{CE}$ are both active. However, once signal ATD of the present invention goes inactive in a read operation, the read voltage applied to the selected word line is removed. This will prevent any of the cells from conducting any current, regardless of the actual state of the cell. The sense amplifiers will therefore provide an invalid output indicating that all of the cells are in a programmed state. FIG. 5 is a schematic diagram of a circuit in the data read out path which avoids the outputting of invalid data in read operations.

Sense amplifier 74 represents one the eight sense amplifiers 36 used in the FIG. 3 memory system. The output of each of these amplifiers is connected to a stage 78 of the data output buffer circuit 38 by way of a latch circuit 76, with latch circuit 76 forming part of the sense amplifier section 36 of the FIG. 3 memory system. As will be explained, when signal ATD is active (high), the output of the sense amplifier 74 is connected to the buffer circuit 78 and when signal ATD is inactive, the sense amplifier 74 is disconnected from the buffer circuit, with the buffer circuit being provided with a level indicative of the state of the sense amplifier 74 just prior to ATD going inactive.

Latch circuit 76 includes a pass transistor 80 connected between the output of the sense amplifier 74 and the input of an inverter circuit 82. The output of inverter circuit 82 is connected to the input of a second inverter circuit 84, with the output of inverter circuit 84 being connected to the input of the output buffer stage 78. The output of inverter 84 is also fed back to the input of inverter circuit 82 by a pair of parallel-connected transistors, including N channel transistor 86 and P channel transistor 88. The gate of transistor 86 receives signal ATD and the gate of transistor 88 receives an inverted signal ATD by way of an inverter 90.

In operation, when signal ATD is active, transistor 80 is conductive and transistors 86 and 88 are off. Thus, the output of sense amplifier 74 is connected to the input of output buffer 78 by way of transistor 80 and inverters 82 and 84. When signal ATD goes inactive, the input of inverter 82 will be the same as the sense amplifier output as well the output of inverter 84. Transistor 80 will be turned off thereby isolating the input of the latch circuit 76 from the output of the sense amplifier 74. Both transistors 86 and 88 will be conductive so that the output of inverter 84 will be applied to the input of inverter 82. Thus, the output of the sense amplifier 74 just before signal ATD goes inactive will be held in the latch circuit after signal ATD goes inactive. Any change in the output of the sense amplifiers when the read voltage is removed from the word line WLN will have no affect on the data read from the array 26 and presented to the output buffer.

Figure 7:
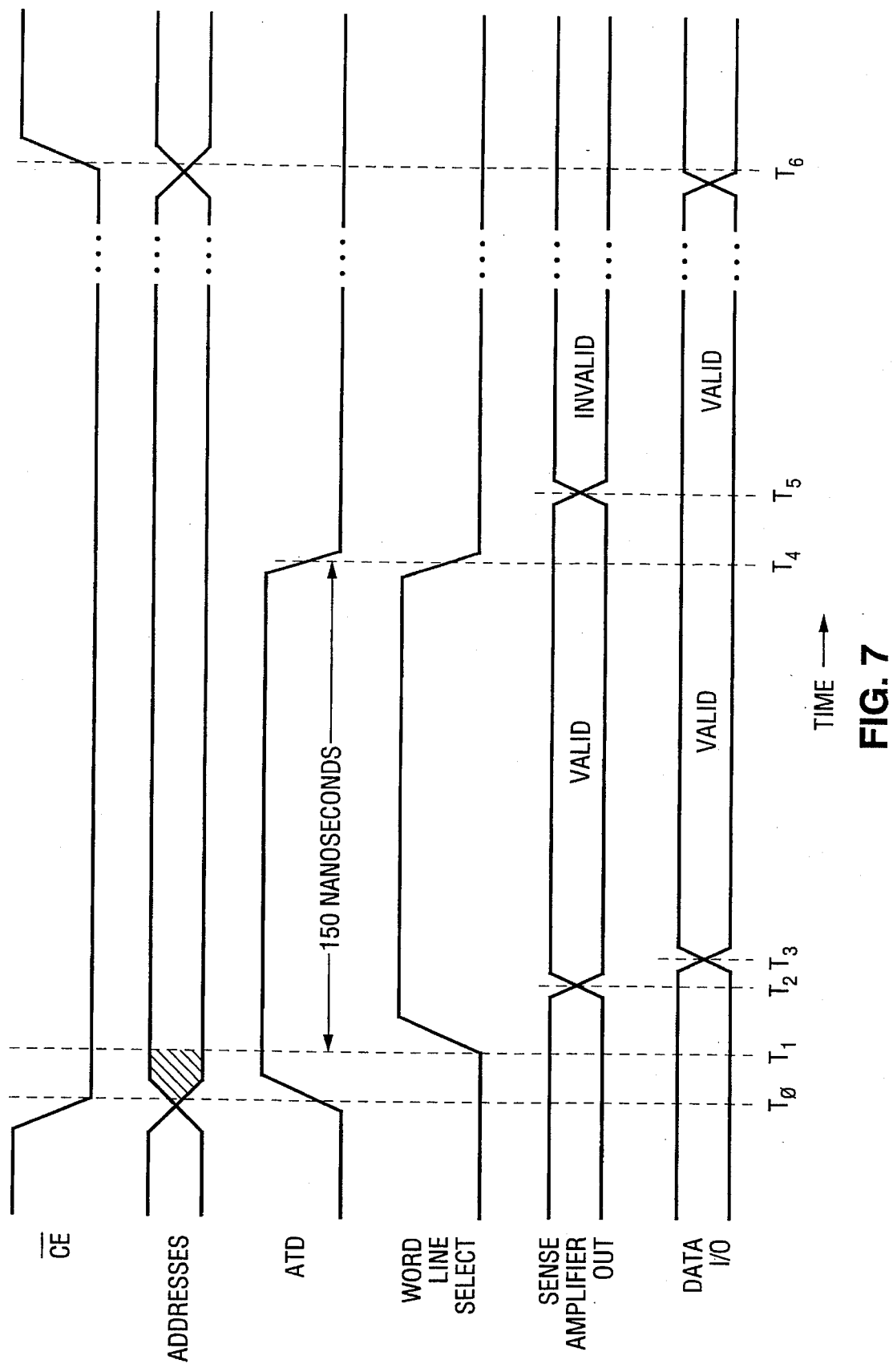
FIG. 7 is a timing diagram illustrating the operation of the FIG. 3 memory system.

FIG. 7 is a timing diagram illustrating the operation of the subject memory system. Assuming that a read operation is to be carried out, the associated processor will cause the chip enable signal CE to go active at time T0. The processor will also present eighteen addresses for the word to be read out of the memory at time T0. The address transition detection circuit 28 will sense that one or more of the addresses has changed state and will cause signal ATD to go active. All of the addresses will be stable at some time T1. An internal timing circuit will cause signal ATD to remain active for an additional 150 nanoseconds after time T1.

Also at time T1, the X Decoder 30 will decode the eight bits of input address and select one of the word lines WLN, as indicated by the active Word Line Select signal of the FIG. 7 timing diagram. A read voltage of +5.5 volts will be applied by X Decoder 30 to the selected word line WLN and a voltage of about +1 to +2 volts generated by the sense amplifier unit 36 will be connected to each of the eight bits lines BLN as determined by the addresses provided to the Y Decode 32. In addition Y Decoder 32 will cause +1 to +2 volts to be coupled to the eight bit lines BLN of the word to be read.

The eight sense amplifiers will each provide a valid output at time T2. These outputs will be forwarded to the data output buffer circuit 78 and to the Data I/O terminals of the memory system. The outputted data is valid at time T3. Signal ATD will remain active for 150 nanosecond after time T1, as previously noted. At time T4, signal ATD will go inactive. This will disable all of the decode gates 54, 56 and 58 of the X Decoder 30 so that all of the word lines of the array will become grounded, including the selected word line. In addition, Y Decoder 32 will no longer couple the +1 to +2 volts to the selected bit lines BLN.

The grounded word lines and deselected bit lines will cause all of the cells of array 26 to turn off at time T4 so that the sense amplifier outputs will no longer be valid at time T5. However, very soon after time T4 and prior to the time T5 when the sense amplifier outputs go invalid, signal ATD will turn off transistor 80 of the latch circuit 76 (FIG. 5) thereby isolating the latch circuit from the sense amplifier output. In addition, transistors 86 and 88 will turn on thereby latching the sense amplifier just prior to the amplifier outputs going invalid. Thus, the latch circuit 76 will present valid output data to the data output buffer circuit 78. The data will continue to be valid until the associated processor causes the chip enable signal CE to go inactive at time T6.

It can be seen from the foregoing that the time in which read voltages are applied to the array 26 during read operations is limited to that time required for the memory to actually perform the read operation. This is true even though the associated processor may maintain signal CE active indefinitely. Thus, the amount of disturb to which the array cells are subjected to is reduced to a minimum.

Thus, a novel memory system has been disclosed. Although one embodiment of the memory system has been described in some detail, it is to be understood that certain changes can be made by those skilled in the art without departing from the spirit and scope of the invention as defined by the appended claims.

I claim:

1. A flash memory system comprising:

an array of flash memory cells arranged into a multiplicity of rows and columns, with all of the cells located in one of rows having a control gate connected to a common word line and with all of the cells in a column having a drain connected to a common bit line:

control means for carrying out memory operations, with the control means comprising
  (1) program means for programming cells of the array based upon a program input address;
  (2) read means for reading cells of the array based upon a read input address, with the read means functioning to apply a read voltage to a selected one of the word lines of the array as determined by the read input address; and disturb limit means for limiting a time period that the read means applies the read voltage to the selected one of the word lines.

2. The memory system of claim 1 wherein the read means comprises a sense amplifier providing an output indicative of current flow through a cell being read and wherein the disturb means comprises data storage means for storing data indicative of the sense amplifier output prior to an end of the time period.

3. The memory system of claim 1 comprising a chip enable input and wherein the disturb limit means functions to terminate the time period that the read means applies the read voltage at a termination time independent of signals applied to the chip enable input.

4. The memory system of claim 1 wherein the disturb limit means comprises address transition detection means for providing an output having a duration which commences when a first transition is detected on an address signal applied to the memory system and which terminates after a last transition is detected on an address signal applied to the memory system.

5. A flash memory system comprising:

an array of flash memory cells arranged into a multiplicity of rows and columns, with all of the cells located in one of rows having a control gate connected to a common word line and with all of the cells in a column having a drain connected to a common bit line:

a memory controller configured to carry out memory read operations wherein a read voltage is applied to a selected word line of the array based upon a read input address; and disturb control circuitry, operably coupled to the memory controller, said disturb control circuitry configured to limit a time period that the memory controller applies the read voltage during one of the read operations.

6. The memory system of claim 5 comprising an address transition detection circuit having an output which is used by the disturb control circuitry to terminate the time period that the memory controller applies the read voltage.

7. The memory system of claim 6 wherein the disturb control circuitry further uses the address transition detection circuitry to commence the time period that the memory controller applies the read voltage.

8. A non-volatile memory system comprising:

an array of non-volatile memory cells;

a plurality of word lines coupled to control gates of various ones of the memory cells;

a plurality of bit lines coupled to various ones of the memory cells;

a memory controller configured to carry out memory read operations wherein a read voltage is applied to a selected word line of the array based upon a read input address;

disturb control circuitry, operably coupled to the memory controller, said disturb control circuitry configured to limit a time period that the memory controller applies the read voltage during one of the read operations;

a plurality of sense amplifiers coupled to the bit lines; and a plurality of data latch circuits coupled to respective outputs of the sense amplifiers, with the data latches being controlled to latch data prior and subsequent to termination of the time period that the memory controller applies the read voltage to the word lines.

9. The memory system of claim 8 wherein the disturb control circuitry comprises address transition detection circuitry having an output which functions to terminate the time period that the memory controller applies the read voltage.

10. A method of controlling a read operation of a non-volatile memory system comprising the following steps:

sensing when there is an initial transition in an addresses applied to the memory during the read operation;

sensing when there is a final transition in addresses applied to the memory during the read operation; and applying a read voltage to a selected word line of the memory system after the final transition is sensed and continuing to apply the read voltage for a predetermined limited time period after the final transition is sensed.

11. The method of claim 10 further comprising the following steps:

sensing for current flow through a cell coupled to the selected word line after the final transition has been sensed; and storing data indicative of current flow after the step of sensing current flow and continuing to store the data subsequent to termination of the limited time period.

12. A method of controlling read operations of a memory system having an array of non-volatile memory cells, with the cells being arranged in rows and columns, with the cells located in one of the rows having their control gates coupled to a common word line and with the cells located in one the columns being coupled to a common bit line, said method comprising the following steps:

applying an active chip enable signal to the memory system;

applying a read addresses to the memory system;

applying a read voltage to a selected one of the word lines based upon the applied read addresses;

sensing for current flow though the bit lines after the read voltage has been applied;

storing read data indicative of current flow through the bit lines; and removing the applied read voltage after said step of storing at a time independent of the applied chip enable signal.

13. The method of claim 12 further comprising the step of sensing a final transition in the applied read addresses and carrying out the step of removing the applied read voltage at a predetermined time period subsequent to the step of sensing a final transition.

14. A method of controlling read operations of a memory system having an array of non-volatile memory cells, with the cells being arranged in rows and columns, with the cells located in one of the rows having their control gates coupled to a common word line and with the cells located in one the columns being coupled to a common bit line, said method comprising the following steps:

applying a read addresses to the memory system;

sensing when a final transition has occurred in the applied read addresses;

applying a read voltage to a selected one of the word lines based upon the applied read addresses;

sensing for current flow though the bit lines after the read voltage has been applied; and removing the applied read voltage at a predetermined time period commencing when said final transition has been sensed.

15. The method of claim 14 further comprising the step of storing data indicative of the sensed presence of current flow and continuing to store the date after removing the applied read voltage.

16. The method of claim 15 further comprising the step of applying an active chip enable signal and causing the chip enable to go inactive after the step of removing the applied read voltage.

* * * * *